(12) United States Patent
Hsieh et al.

(10) Patent No.: US 9,034,695 B2
(45) Date of Patent: May 19, 2015

(54) INTEGRATED THERMAL SOLUTIONS FOR PACKAGING INTEGRATED CIRCUITS

(75) Inventors: Cheng-Chieh Hsieh, Yongkang District (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 409 days.

(21) Appl. No.: 13/444,662

(22) Filed: Apr. 11, 2012

(65) Prior Publication Data

US 2013/0273694 A1 Oct. 17, 2013

(51) Int. Cl.
*H01L 21/00* (2006.01)
*H01L 21/50* (2006.01)
*H01L 23/427* (2006.01)
*H01L 21/48* (2006.01)
H01L 23/498 (2006.01)
H01L 21/56 (2006.01)
H01L 23/31 (2006.01)
H01L 23/00 (2006.01)

(52) U.S. Cl.
CPC ............... *H01L 21/50* (2013.01); *H01L 23/427* (2013.01); *H01L 23/49816* (2013.01); *H01L 23/49827* (2013.01); *H01L 21/4878* (2013.01); *H01L 21/561* (2013.01); *H01L 23/3128* (2013.01); *H01L 2224/73204* (2013.01); *H01L 2224/73253* (2013.01); *H01L 24/13* (2013.01); *H01L 24/16* (2013.01); *H01L 24/29* (2013.01); *H01L 24/32* (2013.01); *H01L 24/33* (2013.01); *H01L 2224/13082* (2013.01); *H01L 2224/13083* (2013.01); *H01L 2224/131* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16227* (2013.01); *H01L 2224/16235* (2013.01); *H01L 2224/2919* (2013.01); *H01L 2224/32225* (2013.01); *H01L 2224/33181* (2013.01); *H01L 2224/92225* (2013.01); *H01L 2224/94* (2013.01); *H01L 2224/97* (2013.01); *H01L 2224/33107* (2013.01); *H01L 2224/16225* (2013.01); *H01L 21/563* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 4,811,082 | A | 3/1989 | Jacobs et al. |
| 4,990,462 | A | 2/1991 | Sliwa, Jr. |

(Continued)

FOREIGN PATENT DOCUMENTS

| TW | I320227 | 4/2009 |
|---|---|---|
| TW | I313505 | 8/2009 |
| TW | I322821 | 4/2010 |

OTHER PUBLICATIONS

"ST19 Specification & Thermal Data," Alpha Next Generation Heat Sinks, Online Catalog—ST-ST19, http://www.alphanovatech.com/c_st19e.html, printed Feb. 14, 2011, 2 pages.

(Continued)

*Primary Examiner* — Yasser A Abdelaziez
(74) *Attorney, Agent, or Firm* — Slater & Matsil, L.L.P

(57) ABSTRACT

A method includes attaching a wafer on a carrier through an adhesive, and forming trenches in the carrier to convert the carrier into a heat sink. The heat sink, the carrier, and the adhesive are sawed into a plurality of packages.

20 Claims, 13 Drawing Sheets

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 5,990,552 | A * | 11/1999 | Xie et al. .................. 257/718 |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,242,778 | B1 | 6/2001 | Marmillion et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,183,132 | B2 * | 2/2007 | Nakamura .................. 438/106 |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 7,964,951 | B2 | 6/2011 | Refai-Ahmed |
| 8,314,483 | B2 | 11/2012 | Lin et al. |
| 2005/0136640 | A1 | 6/2005 | Hu et al. |
| 2006/0022330 | A1 | 2/2006 | Mallari |
| 2007/0086168 | A1 | 4/2007 | Khanna et al. |
| 2007/0108595 | A1 | 5/2007 | Refai-Ahmed |
| 2007/0258213 | A1 | 11/2007 | Chen et al. |
| 2010/0117201 | A1 | 5/2010 | Ching et al. |
| 2010/0127390 | A1 | 5/2010 | Barth |
| 2010/0230805 | A1 | 9/2010 | Refai-Ahmed |

OTHER PUBLICATIONS

"Moderately Configured Aluminum Pin Fin Heath Sinks," COOLINNOVATIONS Advanced Heat Sinks, www.coolinnovations.com; printed Feb. 11, 2014, 1 page.

* cited by examiner

INTEGRATED THERMAL SOLUTIONS FOR PACKAGING INTEGRATED CIRCUITS

BACKGROUND

Integrated circuits are formed on semiconductor wafers. The wafers are sawed into dies, which are packaged before being used. The recent trend shows that the thickness of the wafers became increasing thinner. With thinner wafers, three Dimensional Integrated Circuit (3DIC) formation processes can be accommodated.

The thinned wafers resulted in the difficulty in the integrated circuit manufacturing processes. An example is that the thin wafers have significant warpage, and some of the processes may not be able to be performed on the warped wafers. To solve this problem, when thin wafers are handled or wafers are to be thinned, carriers are bonded to the thin wafers. The carriers are thick enough, and do not suffer from the warpage problem. Through adhesives, thin wafers that are adhered on carriers may remain planar.

The warpage of the thin wafers, however, is rejuvenated whenever the thinner wafers are demounted from the carriers. To solve this problem, the thin wafers may be diced into dies along with the carriers. Since the dies have small sizes, the warpage problem is not significant. A problem of this solution is that the carriers are also diced, and hence cannot be reused.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Packages including carrier-converted heat sinks and the methods of forming the same are provided in accordance with various exemplary embodiments. The intermediate stages of forming the packages are illustrated. The variations of the embodiments are discussed. Throughout the various views and illustrative embodiments, like reference numbers are used to designate like elements.

Figure 1:
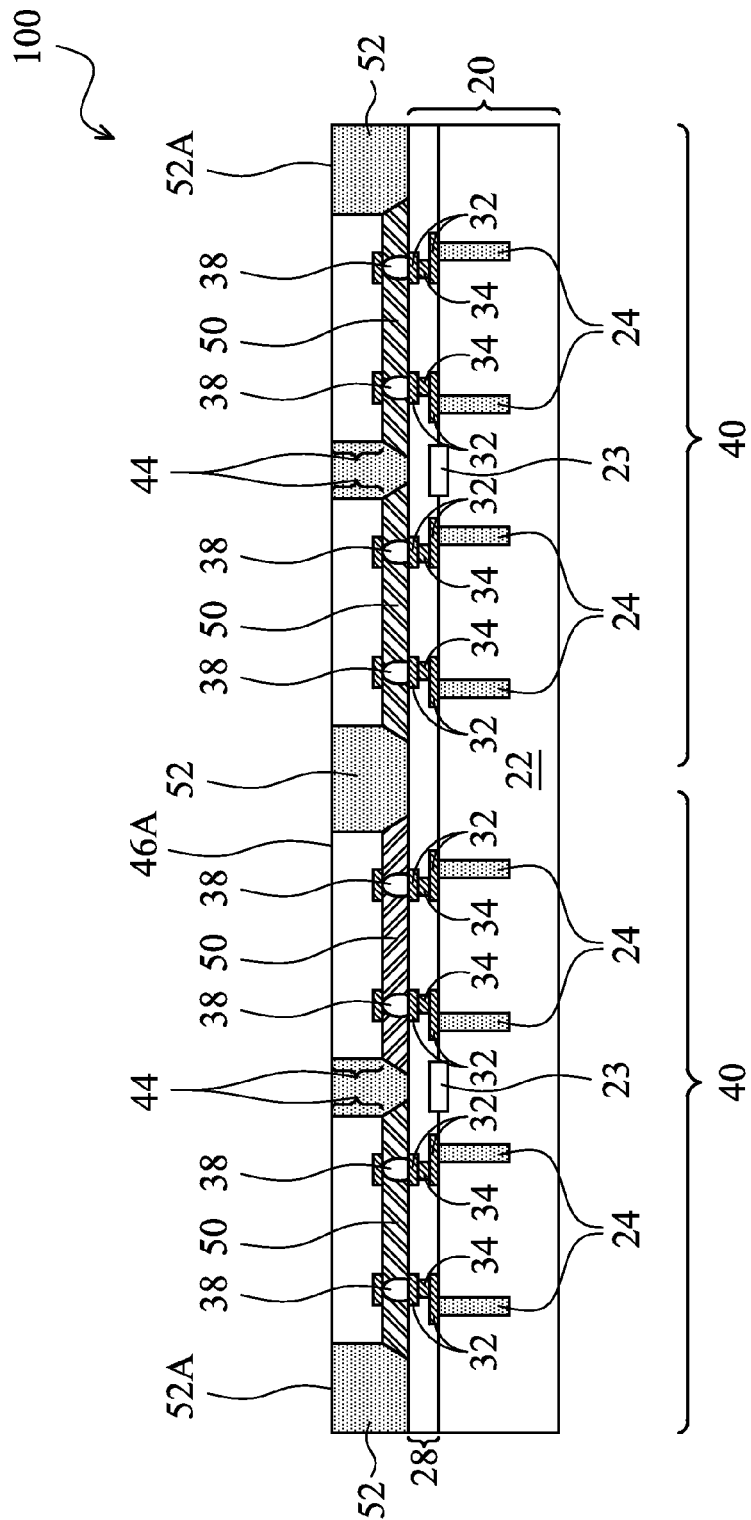
FIGS. 1 through 5B are cross-sectional views of intermediate stages in the manufacturing of packages in accordance with some exemplary embodiments, wherein carriers are converted into heat sinks.
Figure 2A:
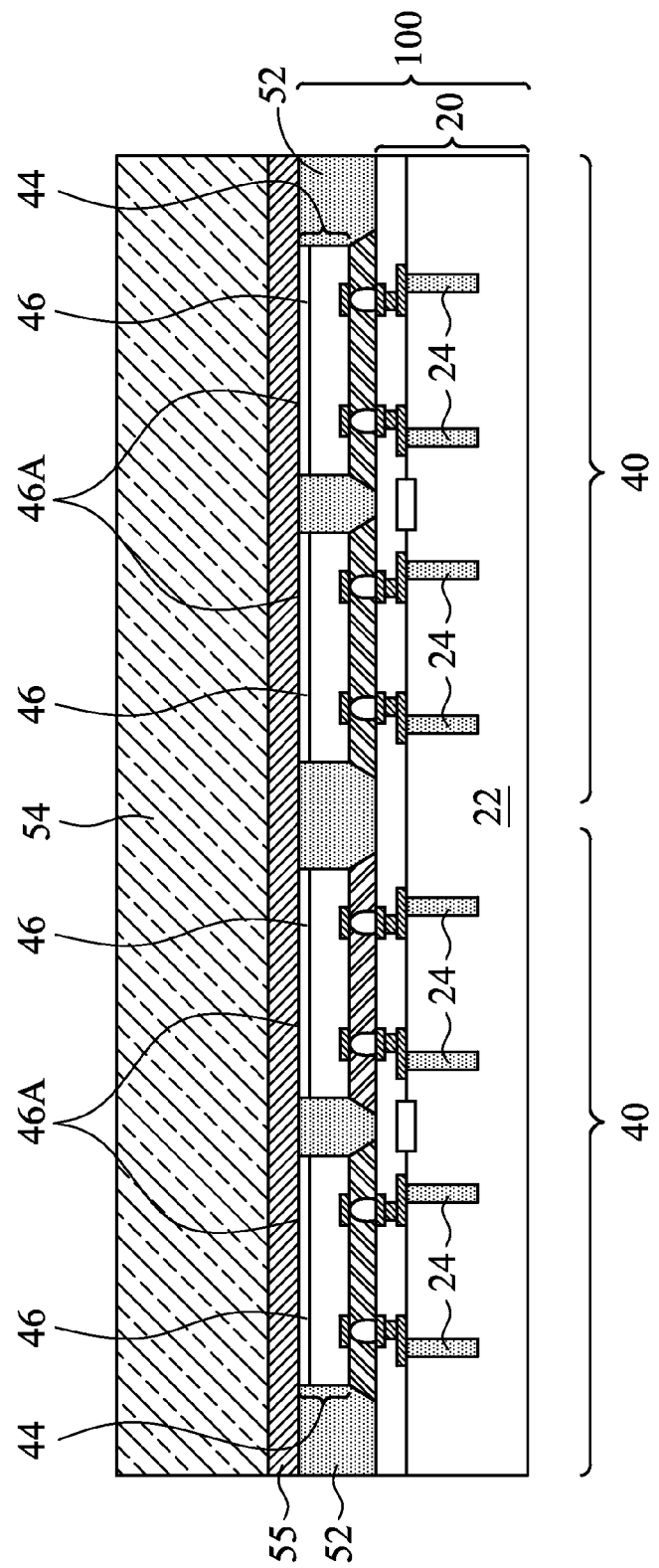
Figure 2B:
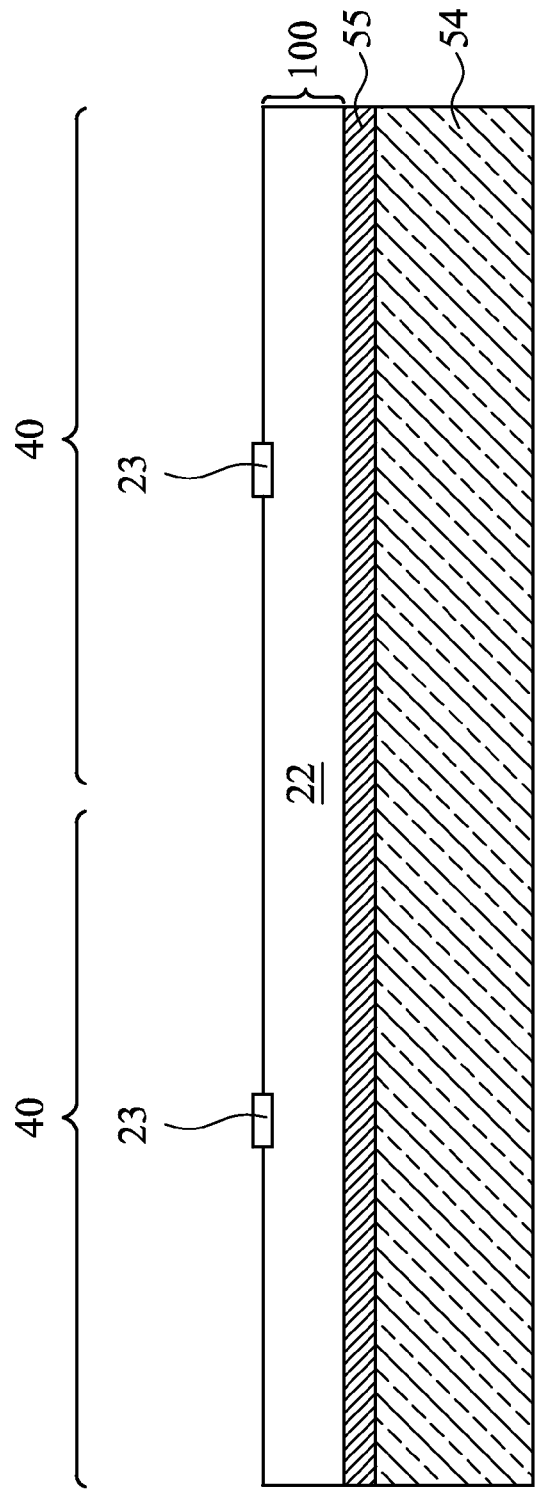

FIG. 1 illustrates a cross-sectional view of wafer 100. In some embodiments, as shown in FIGS. 1 and 2A, wafer 100 includes package component 20, and package components 44 bonded to package component 20. In alternative embodiments, as shown in FIG. 2B, wafer 100 is a device wafer that has no dies bonded thereon, and active devices 23 are formed at a surface of substrate 22. Wafer 100 as in FIG. 2B also includes chips 40 (also known as dies when sawed apart) 40 therein.

Referring again to FIG. 1, package component 20 includes substrate 22. In some embodiments, substrate 22 is a semiconductor substrate, which may further be a crystalline silicon substrate, although it may be formed of other semiconductor materials such as silicon germanium, silicon carbon, or the like. In alternative embodiments, substrate 22 is a dielectric substrate. Package component 20 may be a device wafer, which includes active devices 23 such as transistors formed at surface 22A of semiconductor substrate 22. When package component 20 is a device wafer, it may also include passive devices (not shown) such as resistors and/or capacitors. In alternative embodiments, package component 20 is an interposer wafer that does not include active devices therein. In these embodiments, package component 20 may, or may not, include passive devices formed therein. Through Vias (TVs) 24 may be formed to extend from top surface 22A of substrate 22 into substrate 22. TVs 24 are also sometimes referred as through-substrate vias or through-silicon vias when substrate 22 is a silicon substrate. Package component 20 includes a plurality of package components 40, which may be identical to each other. Package components 40 may be device chips/dies, interposer chips, or the like. Package components 40 are alternatively referred to as chips or dies 40 hereinafter.

Interconnect structure 28 is formed over substrate 22, and is used to electrically connect to the integrated circuit devices, if any, and/or TVs 24. Interconnect structure 28 may include a plurality of dielectric layers 30. Metal lines 32 are formed in dielectric layers 30. Vias 34 are formed between, and interconnecting, the overlying and underlying metal lines 32. Metal lines 32 and vias 34 are sometimes referred to as Redistribution Lines (RDL) 32/34. In some embodiments, dielectric layers 30 comprise silicon oxide, silicon nitride, silicon carbide, silicon oxynitride, combinations thereof, and/or multi-layers thereof. Alternatively, dielectric layers 30 may comprise one or more low-k dielectric layer having a low k value(s). The k values of the low-k dielectric materials in dielectric layers 30 may be lower than about 3.0, or lower than about 2.5, for example.

Connectors 38 are formed at the top surface of package component 20. In some embodiments, connectors 38 comprise metal pillars, wherein solder caps may be, or may not be, formed on the top surfaces of the metal pillars. In alternative embodiments, connectors 38 comprise solder regions. In yet other embodiments, connectors 38 may be composite bumps comprising copper posts, nickel layers, solder caps, Electroless Nickel Immersion Gold (ENIG), Electroless Nickel Electroless Palladium Immersion Gold (ENEPIG), and/or the like.

Package components 44 are bonded to package component 20, for example, through flip-chip bonding. Connectors 38 accordingly bond, and electrically couple, the circuits in package components 44 to RDLs 32 and TVs 24 in package component 20. Package components 44 may be device dies including logic circuits, memory circuits, or the like. Accordingly, package components 44 are alternatively referred to as dies 44 hereinafter. Alternatively, package components 44 may be packages that include dies bonded to the respective interposers, package substrates, and/or the like. On each of dies 40, there may be two or more dies 44 bonded thereon. In some embodiments, dies 44 include substrates 46, which may be silicon substrates in some embodiments. In alternative embodiments, substrates 46 are formed of materials such as silicon germanium, silicon carbide, III-V compound semiconductors, or the like. Accordingly, surfaces 46A of substrates 46 are the surfaces of silicon, silicon germanium, silicon carbide, a III-V compound semiconductor, or the like.

Next, polymer 50 is dispensed into the gaps between dies 44 and package component 20. Polymer 50 may be an underfill, and hence is referred to as underfill 50 hereinafter, although it may also comprise other polymers such as an epoxy. Underfill 50 may also be a molding underfill.

Molding material 52, which may be a polymer, is molded on dies 44 and package component 20, for example, using compress molding. In some embodiments, molding material 52 comprises a molding compound, an epoxy, or the like. A curing step is performed to cure molding material 52, wherein the curing may be a thermal curing, a Ultra-Violet (UV) curing, or the like. In the embodiments dies 44 are buried in molding material 52, after the curing of molding material 52, a planarization step, such as a grinding, may be performed to remove excess portions of molding material 52, which excess portions are over top surfaces 46A of device dies 44. Accordingly, surfaces 46A of substrates 46 are exposed, and are level with top surface 52A of molding material 52.

Referring to FIGS. 2A and 2B, thermal-conductive carrier 54 is attached to wafer 100 through adhesive layer 55. In the embodiments in FIG. 2A, adhesive layer 55 may be in contact with dies 44 and molding material 52. In the embodiments in FIG. 2B, adhesive layer 55 may be in contact with substrate 22. In some embodiments, thermal-conductive carrier 54 is a silicon wafer, which may include crystalline silicon. In alternative embodiments, thermal-conductive carrier 54 includes glass, ceramic, or the like. The thermal conductivity of thermal-conductive carrier 54 may be greater than about 100 Watts/m*K, or greater than about 150 Watts/m*K. Adhesive layer 55 may comprise a thermally conductive adhesive, which may be a Die Attach Film (DAF), a thermal epoxy glue, an adhesive Thermal Interface Material (TIM), or the like.

Figure 3A:
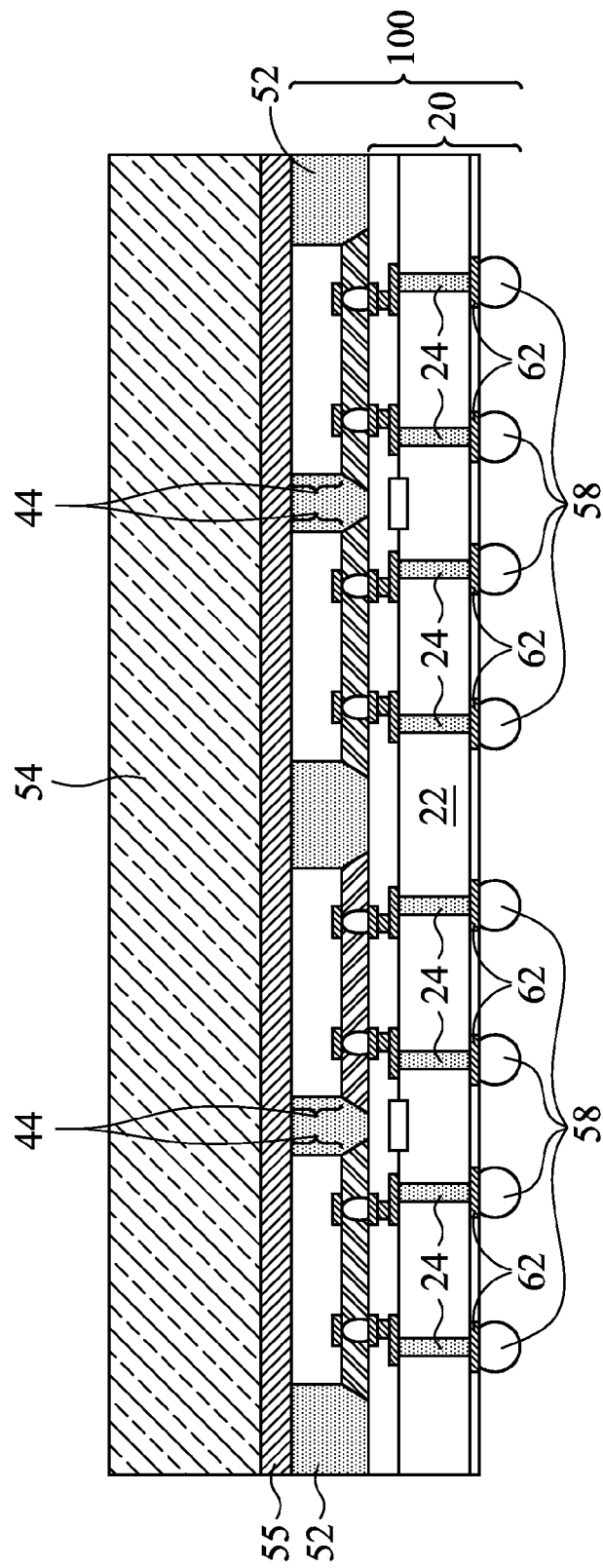

FIG. 3A illustrates the formation of the backside structure of package component 20, which is shown in FIG. 2A. In the formation of the backside structure, a backside grinding is performed on the backside of semiconductor substrate 22 to thin semiconductor substrate 22, until TVs 24 are exposed. Dielectric layer (or dielectric layers) 56 is formed on the backside of semiconductor substrate 22. Connectors 58 are also formed on the backside of package component 20 and electrically coupled to TVs 24. In some embodiments, connectors 58 are solder balls. In other embodiments, connectors 58 may comprise metal pads, metal bumps, solder caps, or the like. RDLs may be formed on the backside of package component 20 and in dielectric layers 56, wherein features 62 represent the RDLs. Connectors 58 may be used to bond to an additional electrical component (not shown), which may be a semiconductor substrate, a package substrate, a printed circuit board (PCB), or the like.

Figure 3B:
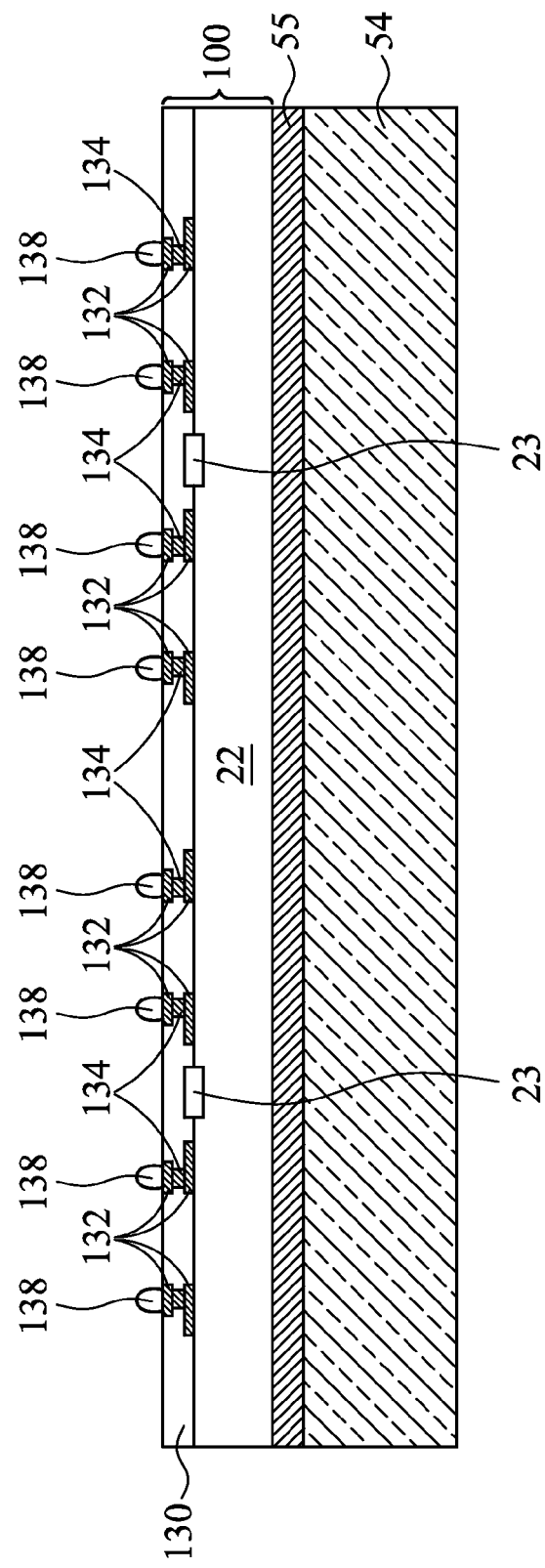

FIG. 3B illustrates the formation of front side interconnect structure 28 on the front side of wafer 100 as shown in FIG. 2B. Active devices 23 may be formed on the front side of substrate 22. Interconnect structure may include metal lines 132 formed in dielectric layers 130. Vias 134 are formed between, and interconnecting, the overlying and underlying metal lines 132. Dielectric layers 130 may include one or more low-k dielectric layer having a low k value(s). The k values of the low-k dielectric materials in dielectric layers 130 may be lower than about 3.0, or lower than about 2.5, for example. Electrical connectors 138 are formed on the front surface of wafer 100.

Figure 4A:
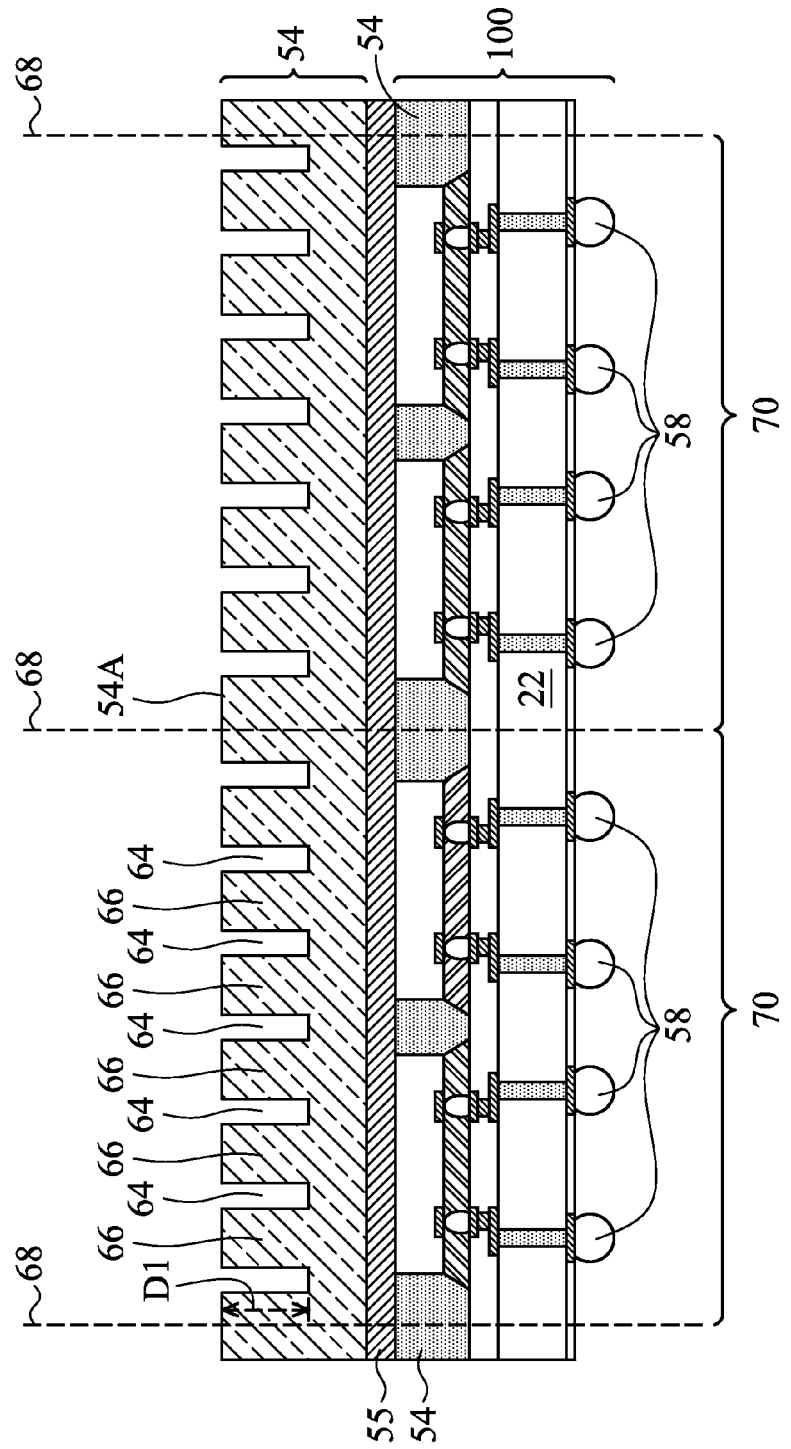
Figure 4B:
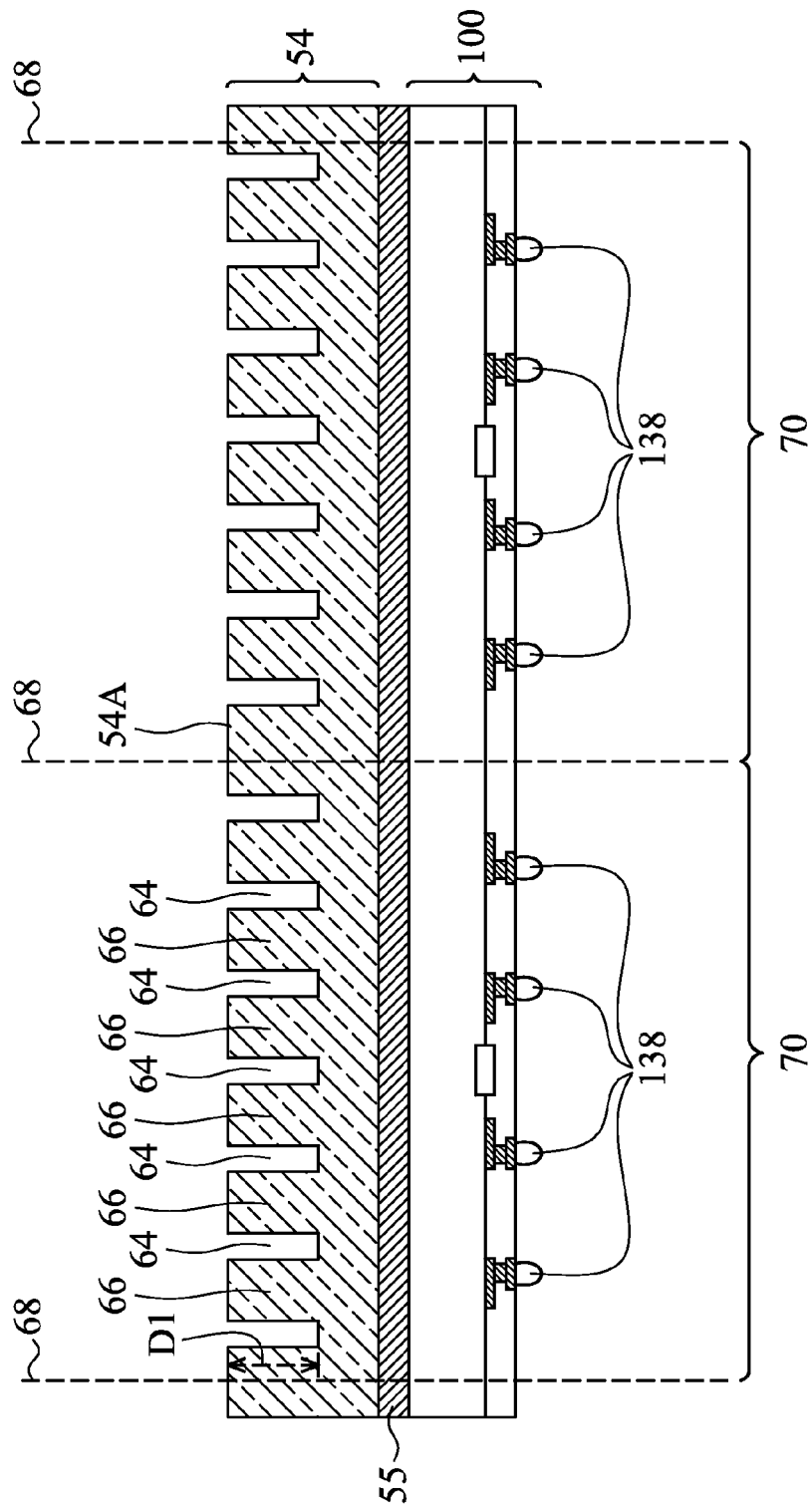

Next, as shown in FIGS. 4A and 4B, trenches 64 are formed in thermal-conductive carrier 54 to convert thermal-conductive carrier 54 into a heat sink, which is also referred to as heat sink 54. Trenches 64 may be formed through etching. Alternatively, trenches 64 are formed by sawing thermal-conductive carrier 54 using a blade. The resulting heat sink 54 includes a plurality of fins 66 between trenches 64. Fins 66 may also form an array. The top view of some exemplary trenches 64 may be found referring to FIGS. 7A and 7B. In the top view of heat sink 54, trenches 64 may include a first plurality of trenches 64A parallel to each other. Trenches 64 may, or may not, include a second plurality of trenches 64B parallel to each other, wherein the second plurality of trenches 64B may be perpendicular to the first plurality of trenches 64A. As shown in FIGS. 4A and 4B, trenches 64 extend from top surface 54A to an intermediate level of thermal-conductive carrier 54. In some embodiments, depth D1 (which is also the fin height of fins 66) of trenches 64 may be between about 200 μm and about 800 μm. The actual depth D1 is related to the thickness of substrate 22. The formation of a Chip-on-Wafer package is thus finished.

Figure 5A:
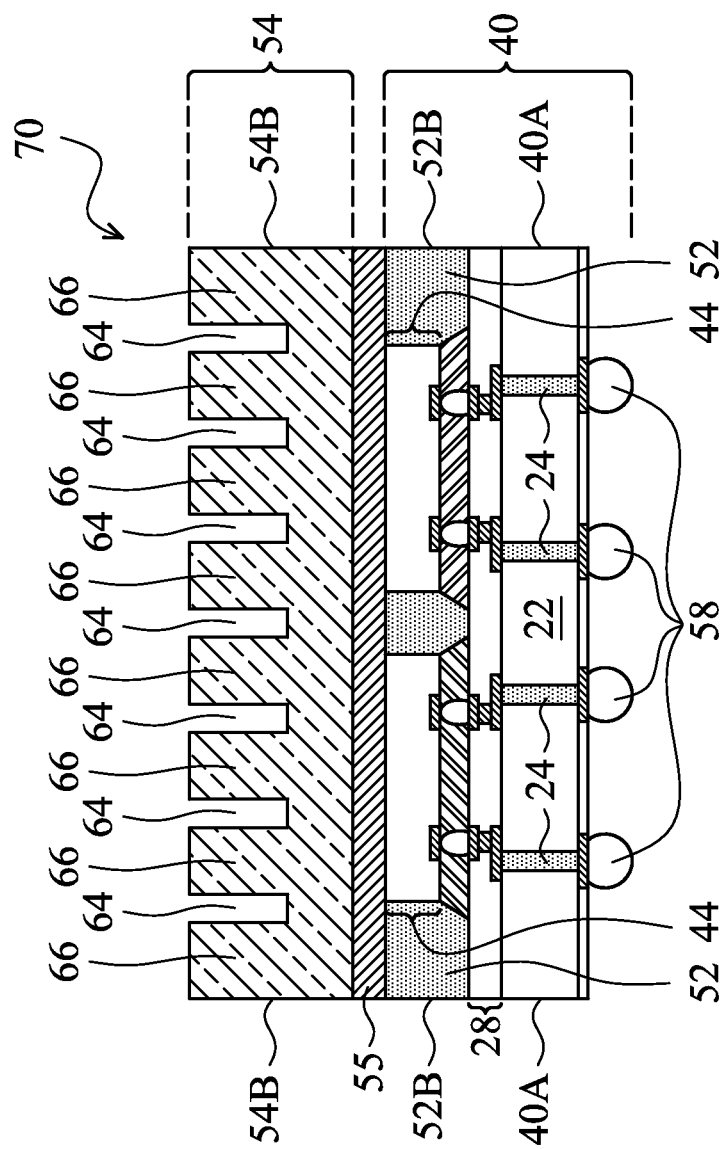
Figure 5B:
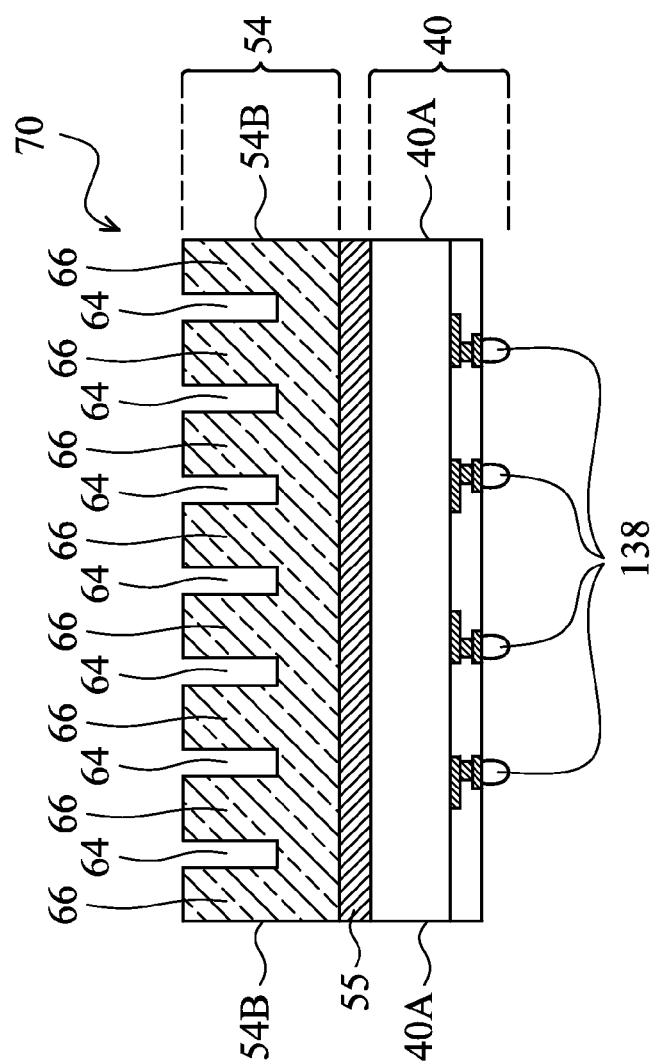

Next, a dicing step is performed along scribe lines 68 to saw the package shown in FIG. 4A or 4B into a plurality of packages 70. The resulting packages 70 are illustrated in FIGS. 5A and 5B, respectively. In FIG. 5A, package 70 includes a piece of heat sink 54, a piece of dies 40, and one or more die 44. It is observed that in package 70, edges 54B of heat sink 54 are aligned to the corresponding edges 52B of molding material 52, and are aligned to the corresponding edges 40B of die 40. In FIG. 5B, package 70 includes device die 40, wherein edges 54B of heat sink 54 are aligned to the respective edges 40A of die 40. Furthermore, the size and the top-view shape of heat sink 54 are the same as the size and the top-view shape, respectively, of die 40.

Figure 6:
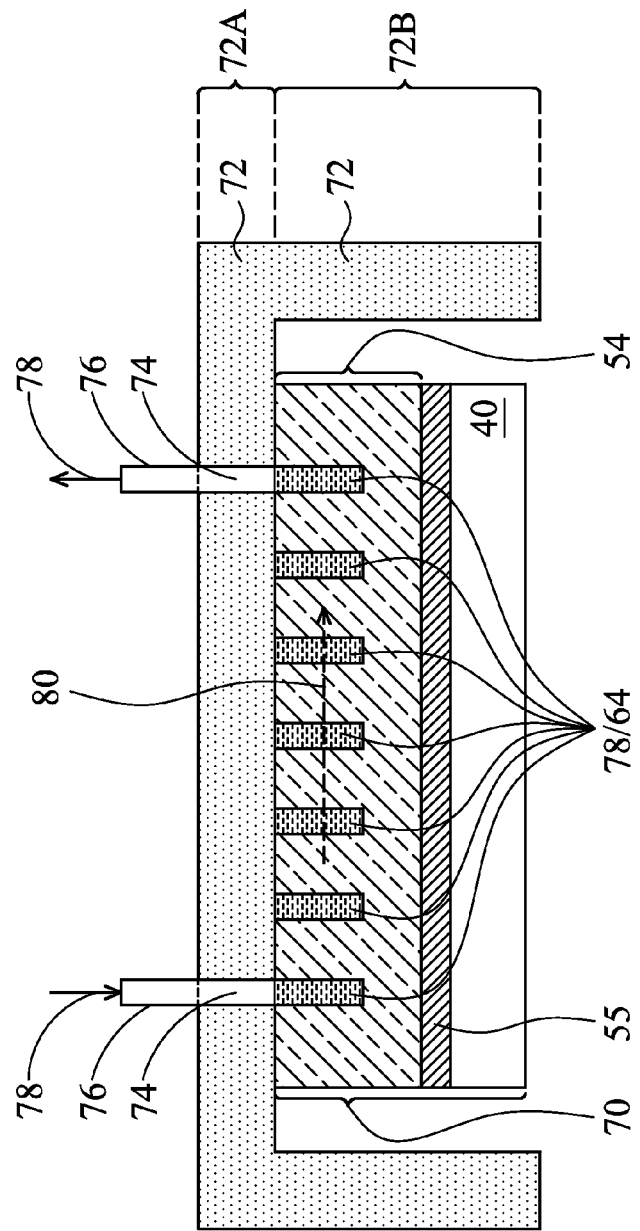
FIGS. 6 through 8 illustrate the use of the packages in accordance with some embodiments.

FIG. 6 illustrates an exemplary package comprising the package 70, which may be the one shown in FIG. 5A or 5B. Heat sink 54 is bonded to Integrated Heat Spreader (IHS) 72, for example, through oxide-to-oxide bonding. In some embodiments, IHS 72 is a metal cap that includes planar portion 72A and side portions 72B, wherein side portions 72B may form a ring in the top view of FIG. 6. Alternatively, IHS 72 is planar. Trenches 64 are sealed by IHS 72 from top. Accordingly, the sealed trenches 64 form micro-channels, through which a cooling media may be conducted. In some embodiments, after the bonding of heat sink 54 to IHS 72, holes 74 may be formed in IHS 72 to connect to trenches 64. Pipes 76 may be installed on IHS 72. Holes 74 may also be pre-formed before IHS 72 is bonded to heat sink 54. In the operation of die 40, heat is generated, and the heat is conducted to heat sink 54. A cooling media 78, which may be a fluid such as water, oil, or the like, is conducted into trenches 64 through pipes 76, and hence the heat is conducted away. Arrow 80 schematically illustrates the direction of the flow of cooling media 78.

Figure 7A:
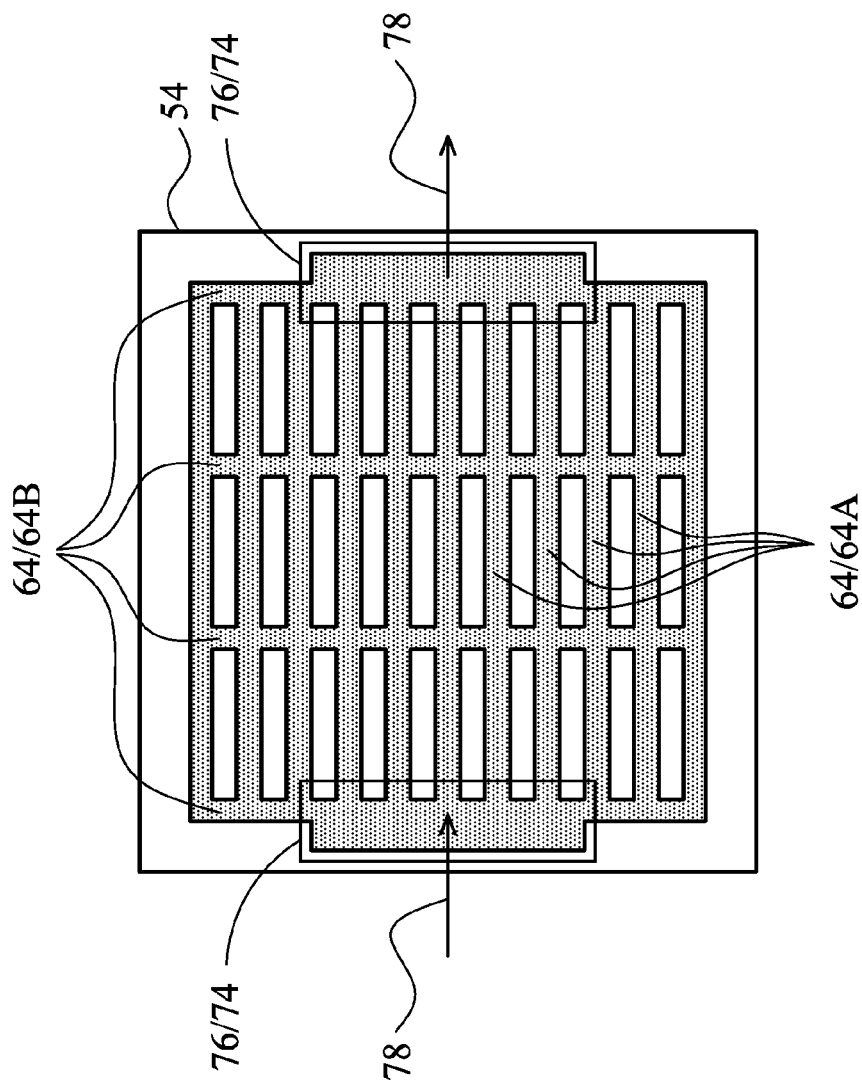
Figure 7B:
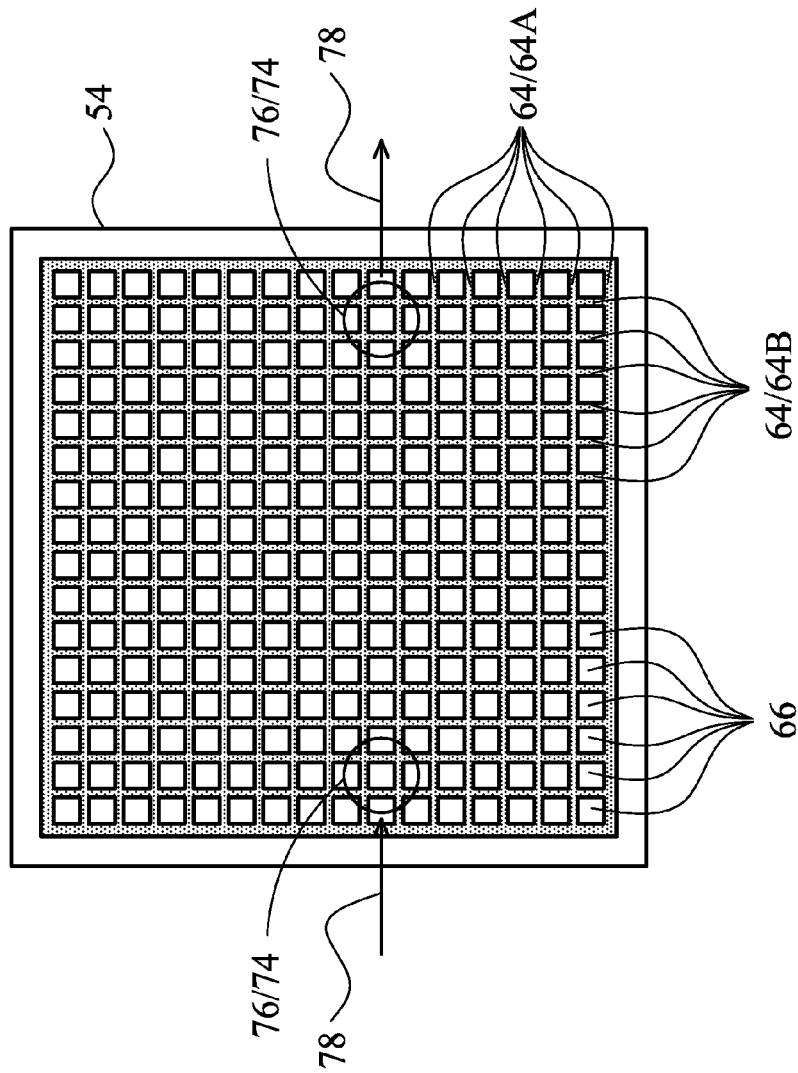

FIGS. 7A and 7B illustrate the top views of the structure shown in FIG. 6 in accordance with exemplary embodiments. Referring to FIG. 7A, some of trenches 64 (marked as 64A) are parallel to each other, and have lengthwise directions pointing from inlet pipe 76 to the outlet pipe 76. Some of trenches 64 (marked as 64B) may be formed in the direction perpendicular to the lengthwise directions of trenches 64A. Trenches 64B interconnect trenches 64A. The spacing between trenches 64B may be greater than trenches 64A in some embodiments.

In FIG. 7B, trenches 64B have substantially the same spacing as trenches 64A, and hence trenches 64A and 64B form a grid structure. In these embodiments, inlet and outlet pipe 76 may be placed on opposite sides or opposite ends of heat sink 54. In these embodiments, trenches 64A and 64B may be used as evaporation channels. Cooling media 78 that is conducted into inlet pipe 76 may evaporate into vapor in trenches 64 by the heat generated in die 40, and the vapor exits out of outlet pipe 76 to bring away the heat.

Figure 8:
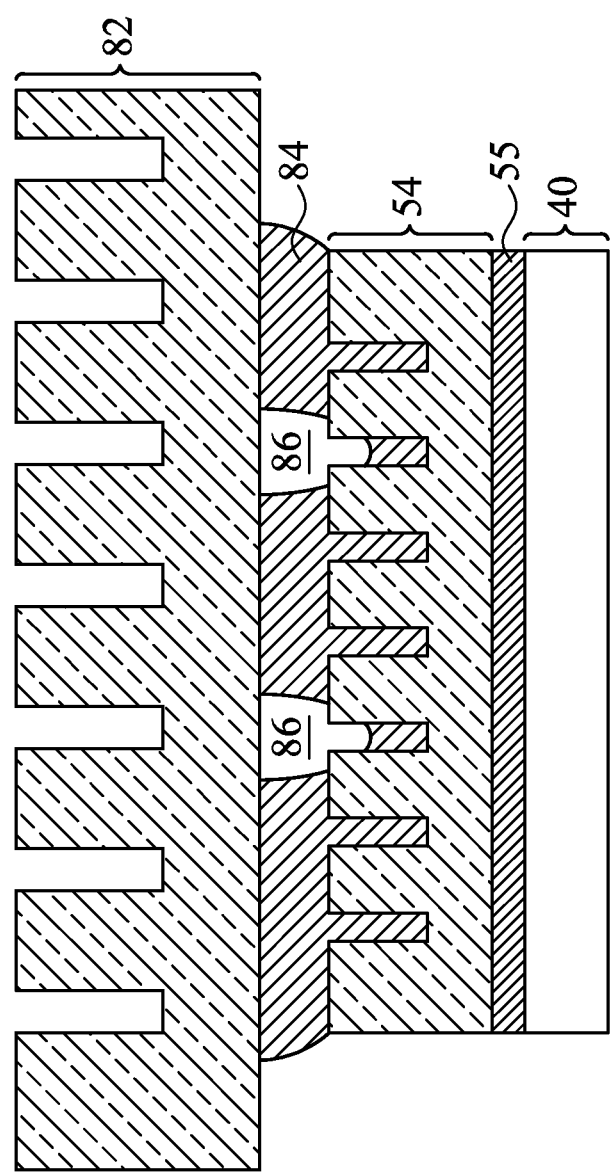

FIG. 8 illustrates the package of the package 70 in accordance with alternative embodiments. In these embodiments, heat sink 54 is bonded to heat sink 82 through thermal-conductive adhesive 84. Heat sink 82 may be formed of a metal or a metal alloy, for example. Thermal conductive adhesive 84 may be formed of a DAF, a thermal epoxy glue, a TIM, or the like. It is known in the art that in the bonding of wafers/dies to heat sinks through adhesives, voids (air bubbles) may be generated in the respective adhesives. The air bubbles are thermal insulators, and are not desirable. With the formation of trenches 64 in accordance with embodiments, however, trenches 64 may absorb some of air bubbles 86. For example, referring to FIG. 8, some of the air bubbles 86 are squeezed into trenches 64, and hence the top-view sizes of air bubbles 86 are reduced. The impact to the thermal conductivity caused by air bubbles 86 is thus reduced. Accordingly, even if the conductivity of adhesive 84 may be lower than that of heat sink 54, the overall thermal conductivity between die 40 and heat sink 82 may be increased by forming trenches 64 in the situations that air bubbles 86 are formed.

In the embodiments, the heat sink production is at the wafer level rather than the die level, and hence the manufacturing cost is reduced. Since the heat sink is sawed along with the dies, there is no alignment problem in the alignment of the heat sink to the dies. Furthermore, even if wafer 100 in FIGS. 1 through 6B is thin, since wafer 100 is not detached from the respective carrier, wafer 100 is not warped throughout the production.

In accordance with embodiments, a method includes attaching a wafer on a carrier through an adhesive, and forming trenches in the carrier to convert the carrier into a heat sink. The heat sink, the carrier, and the adhesive are sawed into a plurality of packages.

In accordance with other embodiments, a method includes attaching a semiconductor wafer to a carrier through an adhesive. After the step of attaching, conductive features are formed on the semiconductor wafer, wherein the conductive features are electrically coupled to devices in the semiconductor wafer. After the step of forming the conductive features, trenches are formed in the carrier to convert the carrier into a heat sink. The method further includes sawing the heat sink, the carrier, and the adhesive into a plurality of packages.

In accordance with yet other embodiments, a method includes attaching a wafer to a carrier through an adhesive, and, after the step of attaching, thinning the wafer. After the step of thinning, trenches are formed in the carrier to convert the carrier into a heat sink. The method further includes sawing the heat sink, the carrier, and the adhesive into a plurality of packages.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   attaching a wafer on a carrier through an adhesive;
   forming trenches in the carrier to convert the carrier into a heat sink; and
   sawing the heat sink, the wafer, and the adhesive into a plurality of packages.

2. The method of claim 1 further comprising bonding a heat spreader to the carrier, wherein the heat spreader seals the trenches, and wherein the trenches are connected to holes in the heat spreader.

3. The method of claim 2 further comprising:
   forming the holes in the heat spreader; and
   connecting pipes to the trenches through the holes.

4. The method of claim 1, wherein the wafer comprises:
   a semiconductor substrate; and
   active devices at a surface of the semiconductor substrate, wherein the method further comprises, before the steps of forming the trenches and sawing, grinding the semiconductor substrate.

5. The method of claim 1, wherein the wafer comprises:
   a substrate; and
   through vias in the substrate, wherein the method further comprises, before the steps of forming the trenches and sawing, grinding the substrate, and forming redistribution lines connecting to the through vias.

6. The method of claim 1, wherein the heat sink, the carrier, and the adhesive are sawed in a same sawing step.

7. The method of claim 1, wherein the wafer comprises an additional wafer therein, wherein the additional wafer comprises a first substrate, and a plurality of vias extending from a top surface of the first substrate into the first substrate, wherein the method further comprises bonding a plurality of dies over the additional wafer, wherein each of the plurality of dies comprises a second substrate, and wherein the carrier is bonded to top surfaces of the second substrates of the plurality of dies.

8. A method comprising:
   attaching a semiconductor wafer to a carrier through an adhesive;
   after the step of attaching, forming conductive features on the semiconductor wafer, wherein the conductive features are electrically coupled to devices in the semiconductor wafer;
   after the step of forming the conductive features, forming trenches in the carrier to convert the carrier into a heat sink; and
   sawing the heat sink, the semiconductor wafer, and the adhesive into a plurality of packages.

9. The method of claim 8 further comprising, after the step of attaching and before the step of forming the conductive features, grinding a semiconductor substrate of the semiconductor wafer.

10. The method of claim 8, wherein at a time the step of sawing is performed, the trenches are not filled.

11. The method of claim 8, wherein the semiconductor wafer comprises a silicon wafer, and wherein the silicon wafer is substantially free from integrated circuit devices therein.

12. The method of claim 8 further comprising:
    sealing the trenches to form micro-channels; and
    connecting pipes to the micro-channels.

13. The method of claim 8, wherein the step of forming the trenches comprises forming a first plurality of trenches parallel to each other.

14. The method of claim 13, wherein the step of forming the trenches further comprises forming a second plurality of trenches parallel to each other and perpendicular to the first plurality of trenches, and wherein the first and the second plurality of trenches are interconnected.

15. A method comprising:
  attaching a wafer to a carrier through an adhesive;
  after the step of attaching, thinning the wafer;
  after the step of thinning, forming trenches in the carrier to convert the carrier into a heat sink; and
  sawing the heat sink, the wafer, and the adhesive into a plurality of packages.

16. The method of claim 15, wherein the wafer comprises through vias in a substrate of the wafer, and wherein the step of thinning comprises thinning the substrate to expose the through vias, and wherein the method further comprises forming conductive features connecting to the through vias.

17. The method of claim 15, wherein at a time the step of sawing is performed, the trenches are not filled.

18. The method of claim 15, wherein the wafer comprises a silicon wafer, and wherein the silicon wafer is substantially free from integrated circuit devices therein.

19. The method of claim 15 further comprising:
  sealing the trenches to form micro-channels; and
  connecting pipes to the micro-channels.

20. The method of claim 15, wherein the step of forming the trenches comprises:
  forming a first plurality of trenches parallel to each other; and
  forming a second plurality of trenches parallel to each other and perpendicular to the first plurality of trenches, and wherein the first and the second plurality of trenches are interconnected.

\* \* \* \* \*